March 30, 1965 W. D. FULLER 3,175,278
METHOD FOR MAKING STRUCTURALLY INTEGRATED
FILM ELECTRONIC ASSEMBLIES
Original Filed Aug. 17, 1960 3 Sheets-Sheet 1

*INVENTOR.*
WILLIAM D. FULLER
*BY* George Sullivan
Agent

INVENTOR.
WILLIAM D. FULLER
BY
George C. Sullivan
Agent

March 30, 1965 W. D. FULLER 3,175,278

METHOD FOR MAKING STRUCTURALLY INTEGRATED FILM ELECTRONIC ASSEMBLIES

Original Filed Aug. 17, 1960 3 Sheets-Sheet 3

INVENTOR.
WILLIAM D. FULLER
BY George [signature]
Agent 3,175,278

METHOD FOR MAKING STRUCTURALLY INTEGRATED FILM ELECTRONIC ASSEMBLIES

William D. Fuller, Palo Alto, Calif., assignor to Lockheed Aircraft Corporation, Burbank, Calif.

Original application Aug. 17, 1960, Ser. No. 50,282, now Patent No. 3,103,642, dated Sept. 10, 1963. Divided and this application Sept. 24, 1962, Ser. No. 225,709
5 Claims. (Cl. 29—155.7)

This application is a divisional application of my pending application Serial Number 50,282, filed August 17, 1960, now Patent No. 3,103,642, entitled "Structurally Integrated Film Electronic Assemblies."

This invention relates generally to the fabrication and construction of electronic components, and more particularly to new types of structurally integrated film electronic assemblies and methods of fabrication thereof.

It is the broad object of this invention to provide improved means and methods of microminiaturizing electronic circuitry.

A more specific object of this invention is to provide a method for making new types of structurally integrated film electronic components which can be simply and economically fabricated by means of automatic or semiautomatic production techniques.

Another object of this invention is to provide a method for making a high value structurally integrated film resistor and a structurally integrated inductor which can be simply and economically fabricated.

A further object of this invention is to provide a method for making structurally integrated variable resistor and inductor components for microminiaturization applications.

In a typical embodiment of the invention the above objects are realized by coating the interior surface of a threaded hole provided in a suitable insulative substrate with a thin layer of metal. The threaded hole is then reamed so that the crests of the thread are removed to a sufficient depth to interrupt the metal film thereon, the roots of the thread remaining metallized to form a continuous spiral film. This metal spiral film may then serve as an inductor or may be converted to a high resistance to serve as a resistor.

The specific nature of the invention as well as other objects, uses and advantages thereof will clearly appear from the following description and the accompanying drawing in which.

Like numerals designate like elements throughout the figures of the drawing.

Figure 1:
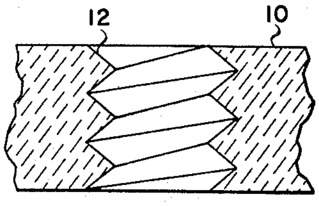
FIGS. 1–3 are cross-sectional views illustrating various steps in the fabrication of a metallized spiral in a threaded hole of a substrate, in accordance with the invention.
Figure 2:
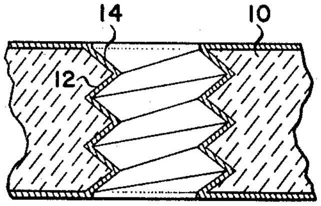
Figure 3:
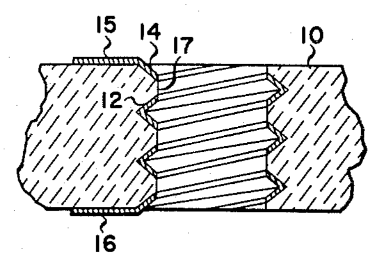

In FIGS. 1–3, a threaded hole 12 is provided in a portion of a suitable substrate 10, which may be any of a variety of suitable materials such as fused silica, quartz, glass, alumina or magnesium oxide. The substrate 10 including the threaded hole 12 is then coated with a film of titanium 14 as shown in FIG. 2. This coating may be accomplished by a method such as is disclosed in U.S. Patent No. 2,746,888. However, I prefer to use the sandwich method disclosed in the commonly assigned copending patent applications Serial Numbers 8,157 now Patent No. 3,022,201 and 8,481 now Patent No. 2,991,195, both filed on February 11, 1960. Obviously any number of threaded holes in the substrate 10 could be simultaneously coated along with the threaded hole 12.

The flat faces of the substrate 10 and any other surfaces thereof may now be etched using well known etchants and paint resists to provide any desired titanium wiring patterns thereon, as indicated at 15 and 16 in FIG. 3, the excess titanium being etched away.

The titanium-coated threaded hole 12 is now reamed so that the crests of the thread are removed to a sufficient depth to interrupt the titanium film thereon, as shown in FIG. 3. The titanium film remaining in the roots of the thread then forms a continuous spiral film extending from one end of the hole 12 to the other. The spiral film so formed may then serve as an inductor having connection points 15 and 16, the value of the inductor being determined by the geometry of the threaded hole 12 and the type of thread provided.

Obviously, any network of series and parallel inductors could be provided in the substrate 10 by using one threaded hole for each inductor and forming the inductors as just described, and the wiring patterns on the faces of the substrate 10 could be etched to provide a desired interconnection pattern therebetween. It is also obvious that other metals besides titanium could be used for providing a metallized film on the thread and faces of the substrate. However, the use of titanium is advantageous in that other types of components are more easily fabricated from an initial titanium film and all such components could then be subjected to this initial titanium coating step without the need of a special coating step for the inductors.

While titanium is a relatively low resistivity metal, it may be desirable in order to reduce R.-F. resistance losses to electroplate the titanium spiral with a film of very low resistivity metal such as gold or silver. Such an electroplated film is illustrated at 22 in FIG. 4.

Figure 4:
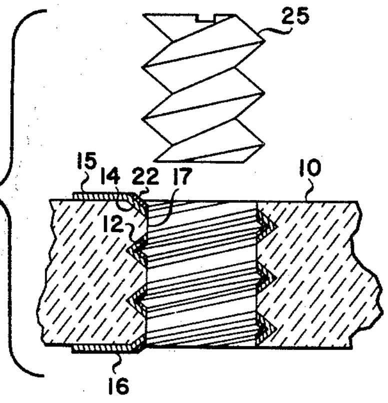
FIG. 4 is a cross-sectional view of an embodiment of a structurally integrated film inductor and its associated core, in accordance with the invention.

If a large value inductor or variable inductor is desired, a threaded magnetic core 25 as shown in FIG. 4 having threads matching the threaded hole 12 may be provided and inserted into the threaded hole 12, thereby serving as a movable core of the spiral film to permit variation of the spiral inductance. Obviously, the use of a magnetic core such as 25 permits a much higher inductance to be obtained.

It is also possible to derive a high value resistor from the titanium spiral film obtained in the embodiment of FIG. 3. This is accomplished by converting the titanium spiral film into a spiral film of high resistivity. A method which has been found well suited for achieving this conversion is disclosed in the commonly assigned copending patent application Serial Number 8,480, filed February 11, 1960 and now abandoned. The method disclosed in this copending patent application involves converting a titanium film into a high resistivity film by simultaneously anodizing and etching the film in a bath essentially consisting of an anodizing electrolyte and etching material capable of etching the metal oxide formed on the titanium film as a result of anodization thereof. The concentration of etching material in the bath is chosen so that the surface of the film is converted into oxide by anodization before being attacked by the etching material, the time of simultaneous anodizing and etching of the film in the bath determining the resultant resistivity thereof.

It has been discovered that this simultaneous anodizing and etching treatment achieves an amazingly uniform and more controlled reduction in the film than could be obtained by any known etching process, thereby making it possible to obtain very thin films of high resistivity and stability. An additional advantage which is also derived is that the resistivity of the film increases not only because of the reduction in its thickness, but also, because when the film becomes very thin the anodization process will have converted a significant thickness of the film into a high resistance metal oxide.

In a preferred embodiment of this simultaneous anodizing and etching technique, a two-bath treatment is provided in which the first bath performs the simultaneous anodizing and etching of the film as described above until an intermediate resistivity is obtained; then the final value of resistivity is obtained in a true anodizing bath without any etching material. This second bath is chosen so that the anodizing process penetrates to a greater depth than did the anodizing process of the first bath, thereby causing a greater portion of the film to be converted into oxide to increase the film resistivity. Using this greater depth of anodizing in the second bath without etching permits greater uniformity and more control of the final resistivity obtained without further thinning of the film and, in addition, permits a higher resistivity to be obtained for a greater film thickness, since more of the film is converted into a high resistance oxide.

More specifically, the two-bath treatment includes immersing the substrate 10 including the threaded hole 12 in the first bath consisting of one gram of sodium fluoride NaS in 200 mm. of 5% sulphuric acid $H_2S_4$ solution for a time of approximately ten minutes with an anodizing current flow starting at about 40 milliamperes per square centimeter and decreasing, and the voltage applied thereto adjustable up to 100 volts. When the resistivity of the film on the threaded hole reaches the order of 80 to 200 ohms per square, the substrate is removed from the first bath, immersed in a second bath, which is a saturated sodium perborate $NaBO_3$ solution. Anodizing current in the second bath starts at 8 milliamperes per centimeter and the voltage is adjustable up to 250 volts. The substrate is held in the second bath until the resistivity of the film increases to the desired value. Measurement of the resistivity may be determined by removing the substrate from the bath and measuring the resistance of the film in the threaded hole in any suitable conventional manner.

The wiring pattern on the faces of the substrate 10, such as indicated at 15 and 16, may be covered with a protective paint or epoxy resist for protection during the above described conversion treatment. The resulting converted spiral film 14' is shown in FIG. 5, the converted film 14' being shown cross-hatched for illustrative purposes.

Figure 5:
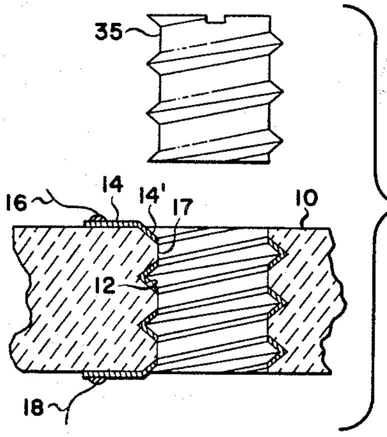
FIG. 5 is a cross-sectional view of an embodiment of a structurally integrated film resistor and its associated variable element, in accordance with the invention.

It will now be evident that between the portion 15 and 16 in FIG. 5 a high value resistor will appear which may suitably be connected to other components of the substrate by means of the interconnection patterns on the faces thereof, the value of the resistor depending upon the resistivity and length of the spiral film. If a variable resistor is desired a metal shorting screw 35 such as shown in FIG. 5 may be threaded in the threaded hole 12. As the shorting screw 35 is turned in the hole 12, the number of turns of the spiral film which are shorted thereby varies, varying the resistance of the spiral film appearing between the wiring pattern portions 15 and 16. Instead of being a metal screw, the screw 35 might be a screw of refractory material having all or a portion of its threads coated with a conductive material.

Figure 6:
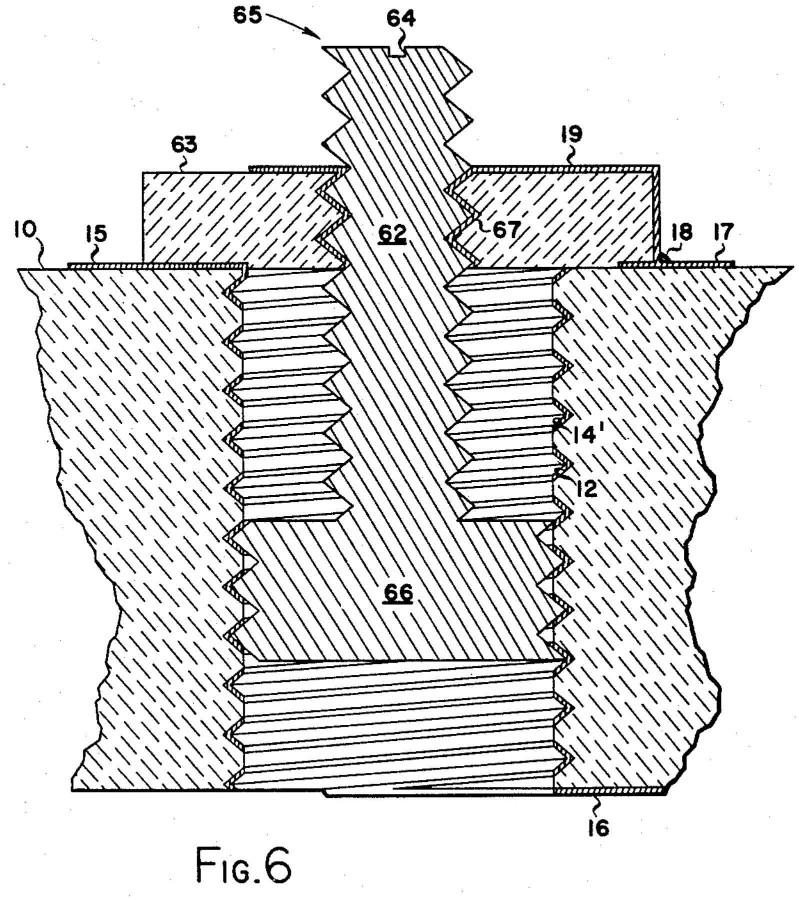
FIG. 6 is a cross-sectional view of a structurally integrated potentiometer, in accordance with the invention.

Also, instead of inserting the metal screw 35 shows in FIG. 5, a metal potentiometer screw 65 could be inserted in the threaded hole 12 as shown in FIG. 6. The potentiometer screw 65 has a disc portion 66 which turns in the thread of the hole 12 and a reduced threaded portion 62 extending up out of the hole 12 and having a groove 64 for turning purposes.

Figure 7:
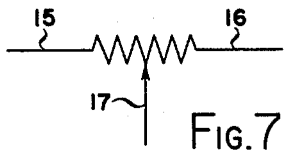
FIG. 7 is an electrical diagram representing the potentiometer of FIG. 6.

An insulative disc 63 is suitably mounted over the threaded hole 12 in the substrate 10 and provided with a metal coated internal thread 67 through which the reduced portion 62 of the potentiometer screw 65 is threaded. The insulative disc 63 is also provided with a metal film 19 which can simultaneously be formed along with the coated thread 67 to permit the metal potentiometer screw to be electrically connected to a portion 17 of the wiring pattern on a face of the substrate 10 by soldering as indicated at 18. Thus, the portion 17 is electrically connected to the variable arm of the resulting potentiometer and the portions 15 and 16 are electrically connected to the ends of the potentiometer as shown in the schematic diagram of FIG. 7.

Figures 8, 9:
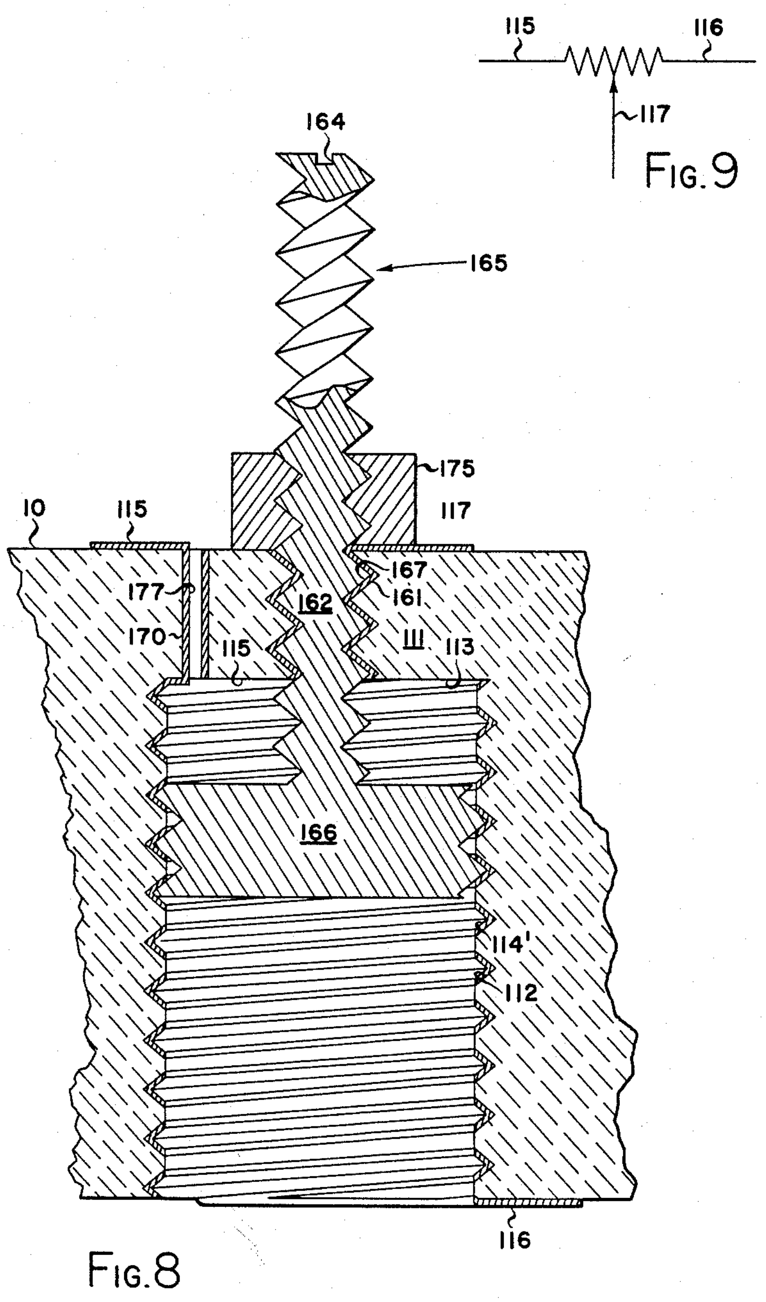
FIG. 8 is a cross-sectional view of another embodiment of a structurally integrated potentiometer in accordance with the invention.
FIG. 9 is an electrical diagram representing the potentiometer of FIG. 8.

Another version of a structurally integrated potentiometer in accordance with the invention is shown in FIG. 8. In this version, the threaded hole 112 goes through only the greater portion of the substrate 10 leaving a remaining substrate portion 111 in which a concentric threaded hole 161 of reduced diameter is provided. In addition, an even smaller hole 170 is provided in the substrate portion 111 on one side of the threaded hole 161 in order to provide communication between the cavity of the threaded hole 112 in the substrate 10 and the top face thereof.

The surfaces of the substrate 10 with its holes 112, 161 and 170 are now coated with titanium as described in connection with FIGS. 1–3 and the faces of the substrate 10 are etched to provide interconnection portions 115, 116 and 117 as shown in FIG. 8. Also portions 113 and 118 at the bottom of the threaded hole 112 are etched to provide electrical insulation between the film 167 of the threaded hole 161 and the film on the threaded hole 112 as shown. The threaded hole 112 is now reamed as described previously to form a spiral film therein. One end of the spiral film is continued to the interconnection pattern portion 116 on the bottom face of the substrate 10 to make electrical connection thereto, while the other end of the spiral film makes electrical connection to the portion 115 on the top face of the substrate 10 by means of the metal film 177 formed in the hole 170 during the coating process.

The spiral film in the threaded hole 112 is now converted to a high resistivity (as indicated by the double cross-hatching in FIG. 8) by the previously described simultaneous anodizing and etching method described in the aforementioned commonly assigned copending patent application. Film surfaces which are to remain at low resistivities may be protected by a suitable resist or epoxy.

A metal potentiometer screw 165 is now provided having a threaded disc portion 166 threaded in the threaded hole 112 and a reduced threaded portion 162 threaded in the metal coated threaded hole 161. A nut 175 is threaded on the portion 162 and may be tightened against the top face of the substrate 10 to hold the potentiometer screw 165 in a locked position. The metal portion 117 thus makes electrical connection to the variable potentiometer screw 165 by means of the contacting threads of the portion 111 and the reduced portion 162, and the portions 115 and 116 make electrical connection to opposite ends of the spiral film, the resulting electrical diagram thereby being that illustrated in FIG. 9.

In the embodiments and methods described herein, it will be noted that titanium has been used as the basic material from which the resultant structurally integrated assembly is fabricated. It is to be understood, that the invention is not limited to the use of titanium or to the specific arrangements and techniques described herein. Other materials and other techniques and arrangements could also be employed by means of which a high resistivity film can be provided on the interior surfaces of one or more holes in a substrate with interconnection patterns therebetween.

However, the use of titanium as described is advantageous in that it is stable at very high temperatures and the conversion treatment for obtaining a high resistivity film therefrom disclosed in the aforementioned commonly assigned copending patent application results in stable films of high resistivity. This conversion treatment may also be successfully employed with zirconium, hafnium and uranium as well as titanium.

The above modifications and variations indicated above are not exhaustive and the invention is to be considered as including all possible modifications and variations in the construction, arrangement and fabrication procedure coming within the scope of the invention as defined in the appended claims.

I claim as my invention:

1. A method of fabricating a structurally integrated resistor in an insulative substrate which comprises forming a threaded hole in the substrate, coating the interior surface of said hole with a film of titanium, reaming said hole so that the crests of the thread are removed to a sufficient depth to interrupt the metal film thereon, the titanium film remaining in the roots of the thread thereby forming a spiral titanium film, and then converting said film to a film of high resistivity by simultaneously anodizing and etching the anodized portion of said film in a bath essentially consisting of an anodizing electrolyte and etching material capable of etching the metal oxide formed on the film as a result of anodization thereof, the concentration of etching material in said bath being chosen so that the surface of said film is first converted into oxide before being attacked by the etching material, the time of simultaneous anodizing and etching the anodized portion of said film in said bath determining the increase in resistivity thereof.

2. A method of fabricating a structurally integrated potentiometer in an insulative substrate which comprises forming an aperture passing through said substrate having first and second threaded hole portions, said first hole portion extending from one face of said substrate almost to the other face thereof and said second hole portion being concentric with said first hole portion and of reduced diameter with respect thereto and extending from the end of said first hole portion to said other face, also forming in said substrate a hole communicating with said first hole portion and said other face, coating the surfaces of said substrate including the inner surfaces of said holes with a film of titanium etching the faces of said substrate to provide potentiometer electrical connection means and to electrically insulate the titanium films on said first and second hole portions, reaming the first hole portion of said aperture so that the crests of its thread are removed to a sufficient depth to interrupt the titanium film thereon, to thereby convert the titanium film remaining in the roots of the thread of said first hole portion to form spiral titanium film, anodizing the titanium film remaining in the roots of the threads of said first hole portion to convert the spiral titanium film to a film of high resistivity, and then inserting a potentiometer screw in said aperture having a first portion threaded in said first hole portion and a second portion threaded in said second hole portion.

3. A method of fabricating a structurally integrated resistor in an insulative substrate which comprises forming a threaded hole in the substrate, coating the interior surface of said hole with a film of titanium by a fused salt process, reaming said hole so that the rest of the threads are removed to a sufficient depth to interrupt the metal film thereon, the titanium film remaining in the roots of the thread, thereby forming a spiral titanium film, and then converting said film to a film of high resistivity by a two-bath treatment wherein a first bath simultaneously anodizes and etches the film until an intermediary resistance is obtained, and the final value of the resistivity is obtained by anodizing in a second bath to the desired value.

4. A method of fabricating a structurally integrated resistor as defined in claim 3 wherein said first bath consists essentially of one gram of sodium fluoride and 2 mm. of 5% sulphuric acid solution, and said second bath consists essentially of a saturated sodium perborate solution.

5. A method of fabricating a structurally integrated resistor in an insulative substrate which comprises forming a threaded hole in the substrate, coating the interior surface of said hole with a film of titanium by a fused salt process, reaming said hole so that the crests of the thread are removed to a sufficient depth to interrupt a titanium film thereon, the titanium remaining in the roots of the thread thereby forming a spiral titanium film, and then converting said titanium film to a film of high resistivity by a two-bath anodizing treatment which includes immersing the substrate in a first bath consisting of one gram of sodium fluoride in 200 mm. of 5% sulphuric acid solution for a time of approximately ten minutes with an anodizing current starting at about 40 milliamperes per square millimeter and decreasing and the voltage applied thereto adjustable up to 100 volts, removing said substrate from said first bath when the resistivity of the film on the threaded holes reaches the order of 80 to 100 ohms per square, and immersing said substrate in a second bath which consists essentially of a saturated sodium perborate solution and anodizing at about 8 milliamperes per centimeter with a voltage adjustable up to 250 volts until the resistivity of the film increases to the desired value.

References Cited by the Examiner

UNITED STATES PATENTS

| | | | |
|---|---|---|---|
| 1,767,715 | 1/30 | Stoekle | 29—155.7 |
| 2,400,404 | 5/46 | Fruth | 29—155.7 |
| 2,481,682 | 9/49 | Payne | 338—87 |
| 2,484,117 | 10/49 | Payne | 338—87 |
| 2,746,888 | 5/56 | Ross | 117—221 |
| 2,917,814 | 12/59 | Ruckelshaus | 29—155.62 |
| 2,934,480 | 4/60 | Slomin | 29—458 |
| 2,945,180 | 7/60 | Parker | 338—308 |
| 2,962,393 | 11/60 | Ruckelshaus | 29—155.62 |
| 2,994,846 | 8/61 | Quinn | 338—308 |

WHITMORE A. WILTZ, *Primary Examiner.*

JOHN F. CAMPBELL, *Examiner.*